(12) United States Patent
Sagal

(10) Patent No.: US 8,497,515 B1
(45) Date of Patent: Jul. 30, 2013

(54) LED DEVICE WITH THERMOELECTRIC MODULE

(76) Inventor: E. Mikhail Sagal, Wakefield, RI (US)

( * ) Notice: Subject to any disclaimer, the term of this patent is extended or adjusted under 35 U.S.C. 154(b) by 136 days.

(21) Appl. No.: 12/844,383

(22) Filed: Jul. 27, 2010

Related U.S. Application Data

(60) Provisional application No. 61/228,866, filed on Jul. 27, 2009.

(51) Int. Cl.
*H01L 27/15* (2006.01)
*H01L 31/12* (2006.01)
*H01L 33/00* (2010.01)

(52) U.S. Cl.
USPC .. 257/79; 257/724; 257/E21.237; 257/E21.5; 362/235; 362/240; 362/234; 438/792; 438/106

(58) Field of Classification Search .................... 257/79, 257/724, E21.5, E21.237; 438/792, 106; 362/235, 240
See application file for complete search history.

(56) References Cited

U.S. PATENT DOCUMENTS

| 2010/0005572 A1* | 1/2010 | Chaplin | 2/411 |
| 2010/0207573 A1* | 8/2010 | Mo et al. | 320/101 |

* cited by examiner

*Primary Examiner* — Cathy N Lam
(74) *Attorney, Agent, or Firm* — McLane, Graf, Raulerson & Middleton, Professional Association

(57) ABSTRACT

An improved light emitting diode (LED) device with a thermoelectric module is provided. In the preferred embodiment, the LED device herein includes a heat sink/housing containing a LED light, heat slug, and LED circuit board attached to a first side of a thermoelectric module and a heat sink on a second side of the thermoelectric module. Heat is conducted from the LED light and through the circuit board to the first side of the thermoelectric module. The heat sink housing dissipates heat from the second side of the thermoelectric module to create a temperature differential across the thermoelectric module and generate electricity.

8 Claims, 4 Drawing Sheets

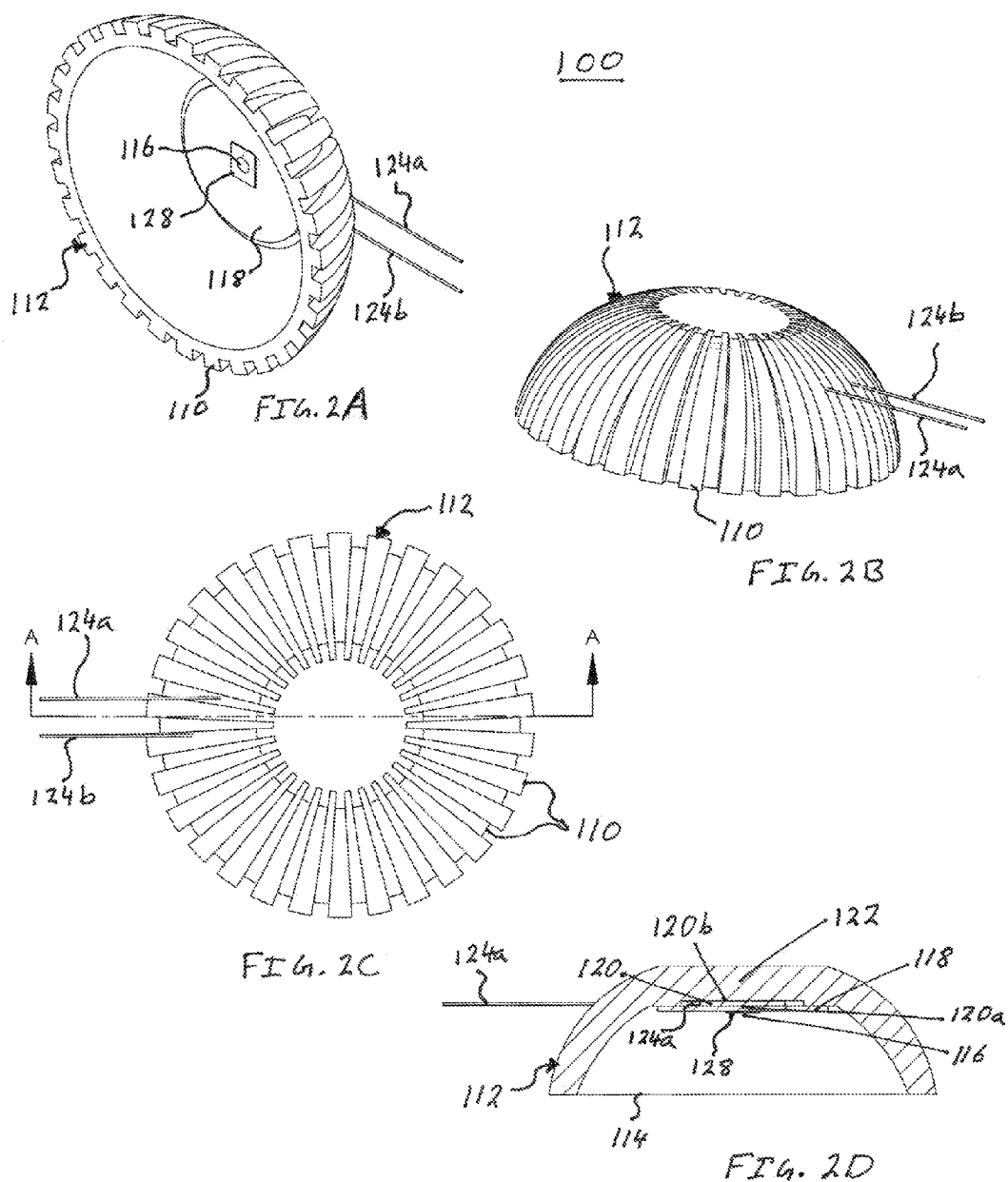

LED DEVICE WITH THERMOELECTRIC MODULE

CROSS-REFERENCE TO RELATED APPLICATION

This application claims the benefit of priority under 35 U.S.C. §119(e) based on U.S. provisional application No. 61/228,866 filed Jul. 27, 2009.

The aforementioned provisional application is incorporated herein by reference in its entirety.

BACKGROUND

The present disclosure relates generally to light emitting diode (LED) devices, and more particularly, to an LED lighting device with thermoelectric module.

LEDs are used in solid state lighting devices as electric light sources. Compared with traditional light sources, such as incandescent and fluorescent light bulbs, they have many advantages, such as lower power consumption and much longer life (e.g., about 50,000 hours). These advantages are only possible, however, if the device is kept cool. The high power LEDs being utilized and promoted for use in today's lighting markets all require heat sinks in order to maintain the LED at temperature that is sufficiently low to give it long life and maintain its brightness.

Traditional incandescent and fluorescent light bulbs have approximately 80% waste heat and radiate the heat out of the light bulb, while LEDs, have approximately 20% or less waste heat but dissipate it by heat conduction out the back of the device. Thus, traditional light sources do not require a heat sink since the heat is radiated out and the internal components are not heat sensitive; whereas, LED light sources require a heat sink since the heat needs to be conducted out of the LED device and the devices are heat sensitive.

LED lighting devices generate critical thermal energy which, if not removed, may prevent proper functioning of the device or limit the lifetime of the device. FIG. 1 illustrates an exemplary LED lighting device employing a heat sink/housing in thermal communication with the LED element so as to provide cooling by dissipating heat into the ambient air.

FIG. 1 shows an exemplary LED lighting device 10 having a heat sink housing 12. The housing 12 may be formed of a thermally conductive material, such as a metal or metal alloy or a thermally conductive polymer material. A lens covering (not shown) may be provided over the open end of the housing 12.

One or more LED light elements 16 (one in the depicted embodiment) are mounted on an LED circuit board 18, which is mounted within the interior cavity defined by the housing 12. A heat slug 28 is adjacent and contacting the LED element 16. The heat slug 28 is in thermal communication with an adjacent portion 22 of the housing 12 (for example, via a thermally conductive vias (not shown) in the circuit board 18, a heat spreader plate or other conductive member (not shown) intermediate the circuit board 18 and the adjacent portion 22 of the heat sink/housing 12, etc.

When the LED device 10 is on, the LED light 16 generates heat and the heat slug 28 conducts the heat through the LED circuit board 18 to the housing 12, which acts as a heat sink to dissipate the heat into the surrounding air. A series of fins 30 may be provided on the heat sink/housing 12 to increase the surface area of the air/housing surface interface and thus facilitate heat dissipation.

The present invention uses a thermoelectric module to recover some of the energy associated with the heat generated by the LED element 16 rather than dissipating it as waste.

A thermoelectric cooler, sometimes called a thermoelectric module, thermocouple, or Peltier device, is a semiconductor-based electronic component that functions as a small heat pump. Alternatively, metallic thermoelectric modules having a junction of dissimilar metals are also known. There are also new thermoelectric modules based on nano and bio technologies that are currently in development that could be used as well. There may be the development of injection molded thermoelectric modules that use a combination of dissimilar fillers or metals that provide for a thermoelectric effect when combined in a molded part. By applying a low voltage DC power source to a thermoelectric module, heat will be moved through the module from one side to the other. One module face becomes cold while the opposite face simultaneously becomes hot. It is important to note that this phenomenon may be reversed whereby a change in the polarity (plus and minus) of the applied DC voltage will cause heat to be moved in the opposite direction. Consequently, a thermoelectric module may be used for both heating and cooling thereby making it highly suitable for precise temperature control applications.

Conversely, thermoelectric materials can convert thermal energy directly into electricity. By applying a constant heat source to one side to make it hot (the heated side) and a heat sink to the other side to keep it cool (the cold side) a temperature difference can be created and maintained. When this happens, the thermoelectric module will convert the temperature difference into electricity. This effect is the Seebeck effect.

Thermoelectric coolers are currently used to harness energy and convert that energy to electricity for applications where there is a tremendous amount of excess heat generated, e.g., geothermal energy, power plants, and generators.

In addition, thermoelectric coolers are used as generators to power wireless sensors. Thermoelectric cooler devices can be attached to a heat source such as a hot water pipe. The thermoelectric cooler also has a heat sink with a wireless sensor attached. As the heat passes from the heat source to the thermoelectric module, the heat sink keeps the heat sink side of the thermoelectric module cooler than the heat source side, resulting in a temperature difference which is converted into electricity to power the wireless sensor.

As a result of the lower power consumption and longer life of LEDs, compared to traditional light sources, today's lighting market and governments worldwide are utilizing and promoting use of high power LEDs. With government and market support, LEDs are gaining wide acceptance and adoption into mainstream lighting applications. As the global lighting requirements are continuously growing, LEDs are enabling emerging markets and under developed areas to have light sources because of the low power consumption and ability for LEDs to be powered by solar energy.

The present disclosure contemplates a new and improved LED lighting device, which includes a thermoelectric module for converting waste heat from the LED light elements into electricity.

SUMMARY

In one aspect, the present disclosure provides an improved LED device having a thermoelectric module. By thermally coupling one side of the thermoelectric module to the LED and the opposite side of the thermoelectric module to a heat sink/housing member, a temperature difference is created which enables the waste heat to be converted into electricity. The amount of electricity generated is dependent upon a number of factors, including the temperature difference across the thermoelectric module, the thickness of the thermoelectric module, and the number of thermoelectric conductors present.

In the device of the present disclosure, the LED light is thermally coupled to one side of the thermoelectric module to provide a constant heat source during operation of the LED, and a heat sink/housing is thermally coupled to the other side of the TE module to cool the thermoelectric module and maintain the necessary temperature drop across the thermoelectric module. The heat sink/housing also serves to maintain the temperature of the LED within a range that allows it to maintain its brightness and longevity.

In another aspect, a method for generating electricity using a LED light device includes thermally coupling the LED lighting element(s) to one side of a thermoelectric device and a heat sink/housing device to the opposite side of the thermoelectric device. In operation, a DC or AC voltage is applied to the LED and heat generated by the LED is thermally coupled to the thermoelectric module. Heat passing through the thermoelectric module is dissipated using a heat sink to create a temperature differential across the thermoelectric module, which in turn generates electricity. The electricity generated may be used to power another LED or other electronic device, be delivered to a power grid, be stored in an electricity storage device, be converted to mechanical energy, etc.

One advantage of the present development is that it creates electricity that can be used to supplement and reduce the energy used from the utilities to power lights and other devices. Generating supplemental energy reduces the amount of electricity needed from the utility companies, enabling users to conserve energy and reduce costs. In so doing, the present development further enhances the already significant energy savings offered by utilizing LED lighting devices in place of traditional electric light sources, providing an opportunity to significantly reduce daily energy consumption and reduce carbon emissions.

Another advantage resides in the fact that the creation of free electricity can offset or recover the cost of incorporating the thermoelectric module into the LED lighting device.

Still further benefits and advantages of the present development will become apparent to those skilled in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

FIGS. 2A and 2B are pictorial views of an LED lighting device in accordance with a first exemplary embodiment of the present invention.

FIG. 2C is a top plan view of the LED lighting device appearing in FIGS. 2A and 2B.

FIG. 2D is a cross-sectional view taken along the lines A-A in FIG. 2C.

DETAILED DESCRIPTION OF THE PREFERRED EMBODIMENTS

Figure 1A:
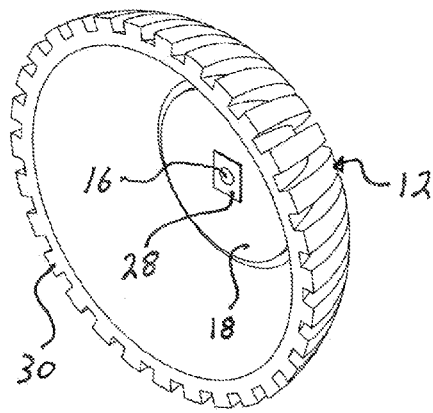
FIGS. 1A and 1B are pictorial views of an exemplary prior art LED lighting device.
Figure 1B:
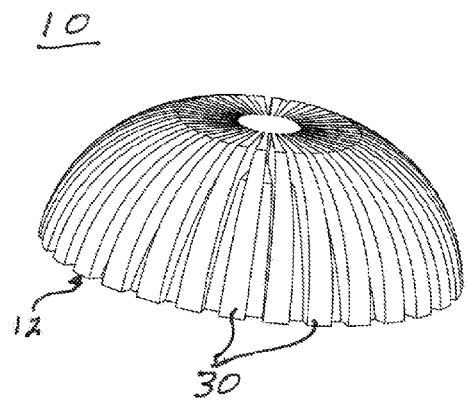
Figure 1C:
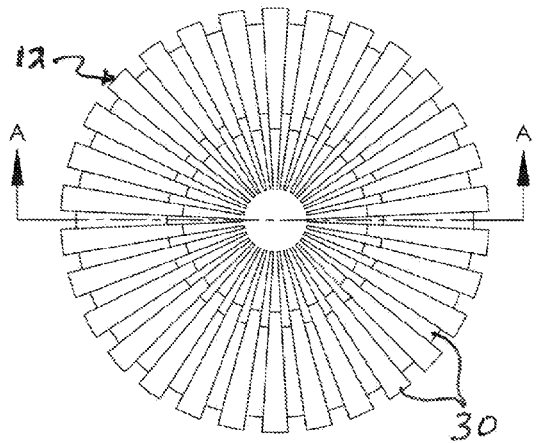
FIG. 1C is a top plan view of the prior art LED lighting device appearing in FIGS. 1A and 1B.
Figure 1D:
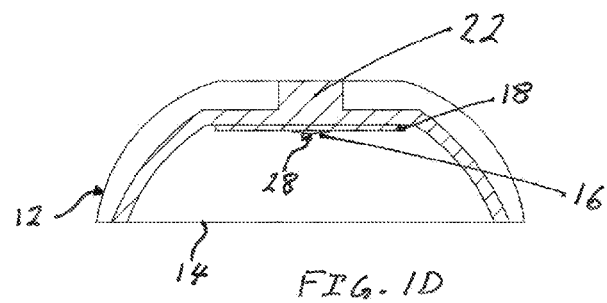
FIG. 1D is a cross-sectional view taken along the lines A-A in FIG. 1C.

Referring to the drawings, wherein like reference numerals refer to like or analogous components throughout the several views, and with particular reference to FIG. 2, there appears an LED device 100, which includes a housing 112, which may be formed of a thermally conductive material, such as a metal or metal alloy, or, more preferably, a thermally conductive polymer material, such as a thermally conductive composite material comprising a polymer matrix and a thermally conductive filler. The housing 112 thus acts as both a housing and a heat sink.

A series of fins or ribs 110 are provided to increase the surface area of the heat sink/housing member 112 to enhance the dissipation of heat to the ambient air. It will be recognized that other geometric configurations for increasing the surface area of the housing/air interface, such as pins or other protrusions, etc., may be provided instead of fins and in some cases a fan may be attached to the heat sink to help remove more heat. A lens covering (not shown) may be provided to cover the open end 114 of the heat/sink housing 112.

One or more LED elements 116 (one in the depicted exemplary embodiment) is mounted on a circuit board 118, which in turn is mounted within the interior cavity defined by the heat sink/housing 112. The circuit board 118 includes the conductors for electrically coupling the LED to an external power supply such as the power supply (AC mains) of a building, a vehicle power supply, etc. The circuit board also carries any other associated electronics associated with the LED device 110, as would be understood by persons skilled in the art. The circuit board 118 may be, for example, a glass/epoxy printed circuit board. The circuit board 118 may also be, for example, a thermally conductive extrudable or injection moldable polymer. More preferably, the circuit board 118 may be an aluminum or other metal core printed circuit board of a type that may advantageously be used to conduct heat away from the LED element 116.

A thermoelectric module 120 is disposed between the circuit board 118 and an upper end of the heat sink/housing 112. The thermoelectric module 120 is preferably a semiconductor-based thermoelectric module, although any other device for generating electricity from heat may be employed. A thermally conductive heat slug 128 surrounds and contacts the base of the LED element 116. The heat slug 128 is in thermal communication with a first side 120a of the thermoelectric module 120. A second side 120b of the thermoelectric module 120 is in thermal communication with the heat sink housing 112, e.g., via an aligned and facing adjacent portion 122 of the heat sink housing 112.

The heat from the heat slug 128 may be coupled to the surface 120a via a number of methods. For example, one or more thermally conductive vias may be provided by drilling holes in the circuit board 118 and filling the holes with a thermally conductive material. Optionally, a thermally conductive heat spreader plate may be disposed between the upward facing surface of the circuit board and the downward facing surface 120a of the thermoelectric module 120. Thermal communication between the upper surface 120b of the thermoelectric module 120 may be via direct contact. It will be recognized that each thermal joint may include a thermally conductive material such as a thermally conductive grease, etc., to enhance or facilitate heat transfer.

Electrical leads 124a and 124b are electrically coupled to the thermoelectric module 120 and exit the heat sink/housing 112, e.g., via openings therethrough, for electrically coupling the thermoelectric module 120 to a power grid, power storage device, an electronic or electrical device to be powered, a motor or other device for converting electrical energy into mechanical work, or the like.

The LED device 100 is powered by an external power source, as described above. During operation, the LED light element 116 creates heat which is conducted by the heat slug 128 and other components in the thermal pathway to the bottom side 120a of the thermoelectric module 120. The heat is conducted through the thermoelectric module to the second surface 120b of the thermoelectric module 120, where it is dissipated by the heat sink housing 112. By applying heat to the first side 120a of the thermoelectric module 120 with the LED 116 and withdrawing heat from the second side 120b of the thermoelectric module 120 using the heat sink 112, a temperature differential is established which results in the generation of an electrical current.

Since LEDs generate a large amount of heat and lights will always be used, all of this waste heat must be dissipated and managed. The device in accordance with the present disclosure provides a means for converting this waste heat into electricity and, offers the possibility of having millions of low power electric generators throughout the world. For example, under the right temperature differences and conditions, it may be possible to generate 1-3 Watts of power from one 1.5 square inch thermoelectric module installed in a device in accordance with this disclosure with LED's running 6-10 Watts. This equates to approximately 15-30% efficiency and the power generation could immediately be applied towards the overall local electricity usage by directing the power back into the electric grid. Thermoelectric modules are continuously being improved in technology and efficiencies. Thermoelectric modules are most efficient when designed for the specific application. Those skilled in the arts will understand this and know that performances will vary and can be tailored to the LED application. In other embodiments the electricity generated could be directed back to power another LED or to an electricity storage device to be captured for future use. This additional electricity could minimize the usage of electricity from the utility companies. Alternatively, the thermoelectricity generated by the device in accordance with this disclosure could be converted into mechanical energy and stored as potential energy for later use or used to perform mechanical work.

In alternative embodiments, the LED lighting device herein may include more than one LED light elements within a common heat sink housing with each LED element coupled to a heat slug, and all of which may be mounted on one or more circuit boards. Each circuit board may have one or more associated thermoelectric modules disposed between the circuit board and the heat sink/housing 112 as described above.

In certain embodiments, the LED lighting devices of the present invention may be used in connection with a home or other structure having a secondary electricity grid to receive the power generated by the LED devices. This grid could then feed the power needs of the house in conjunction with power from the electric company, reducing the paid electricity usage.

In certain embodiments, the grid could feed power to areas that are more power hungry and/or less energy efficient, e.g., under programmed control, thereby maximizing the usage of the "free" energy generated by the LED devices herein.

In certain embodiments, the power could be stored for later use. For example, if the LED lights are used during off-peak times, the power generated by the thermoelectric device could be stored for later use, e.g., to supplement electricity usage during "peak" times to help reduce electricity costs.

In certain embodiments, the LED circuit could be incorporated directly on the back of the thermoelectric module, so that the LED could be soldered directly to the thermoelectric module, eliminating the need for a separate circuit board.

In other embodiments, the thermoelectric module is used as the power generator, as well as the thermal interface between the LED and the thermoelectric module and the thermoelectric module and the heat sink, by utilizing a thin, flexible thermoelectric module that has a soft surface that would act as a thermal interface.

In certain embodiments, forced convection cooling may be provided to keep the thermoelectric module cool as well as cool the LEDs. The cooler the heat sink, the cooler the cold side of the thermoelectric module and the more efficient the thermoelectric generator. The cooler the LED, the brighter it runs and the longer it lasts. For example, the lighting locations may be positioned relative to an HVAC cooling system to allow air to blow directly on the heat sink/housing members to keep them cooler and generate more electricity from the device.

In still further embodiment, excess heat that is conducted away from the LED and thermoelectric module through the heat sink/housing could be further used, e.g., in HVAC and building structures. For example, this dissipated heat could be fed to heat exchangers where it could be used to augment system heating, water heating, or any other auxiliary heating, thereby indirectly reducing the energy consumption in that part of the building's use and operation.

In alternative embodiments, the LED circuit board 118 could be incorporated directly onto the back of the thermoelectric module 120 thereby eliminating the need for a separate circuit board and decreasing the number of parts of the LED device.

Also, in certain embodiments the heat sink housing 112 is injection molded using a thermally conductive polymer material. Injection molding of the housing 112 enables the LED devices to be made in various shapes and sizes and enables incorporation of integral features for mounting the LED light 116, LED slug 128, LED circuit board 118, and/or thermoelectric module 120. Injection molding also allows overmolding the thermoelectric module during manufacture to eliminate an assembly operation. Also, the circuit board and thermoelectric module can be consolidated with the heat sink/housing during the molding operation.

In a further alternative embodiment, a supplemental heater (not shown) which may be for example a resistive heating element, is added to the LED device 100 of FIG. 2 to increase the temperature difference across the two sides of the thermoelectric module 120, thereby increasing the electricity generated. The supplemental heater may be of the type as described below and shown in FIG. 4. The supplemental heater is in thermal communication with the first, hot side 120a of the thermoelectric module 120, but is thermally isolated from the LED light 116 and/or the LED circuit board 118 to avoid substantially heating the LED and LED circuit board.

The supplemental heater may be contained within the housing 112, but isolated from the LED light 116 and the circuit board 118. In other embodiments, the LED device 100 may be separated from the thermoelectric module 120 and even the heat sink depending on the lighting or application design constraints, but connected by a heat conductor, heat pipe, or other heat transfer deceive to conduct the heat from the LED light to the hot side 120a of the thermoelectric module to generate the temperature differential across the thermoelectric module, but away from the LED light 116 and circuit board 118.

Figure 3A:
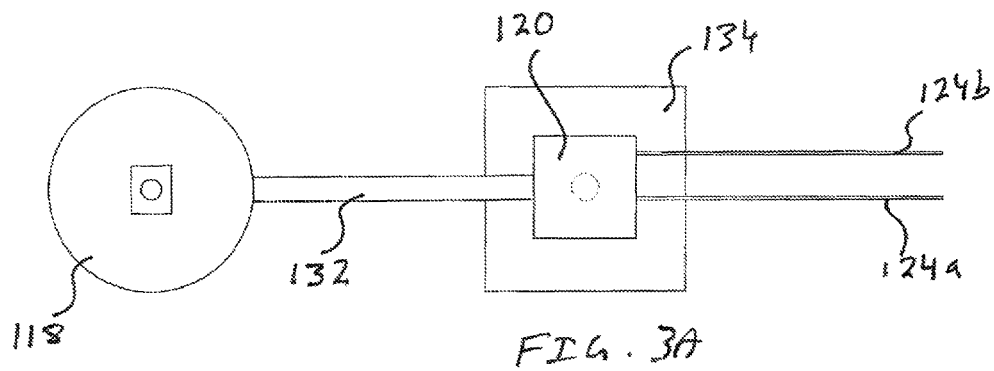
FIGS. 3A-3C illustrate an LED lighting device according to a second exemplary embodiment herein, wherein the LED element(s) are located remotely with respect to a thermoelectric module and a heat pipe thermally is provided for coupling the LED element(s) to the thermoelectric module.
Figure 3B:
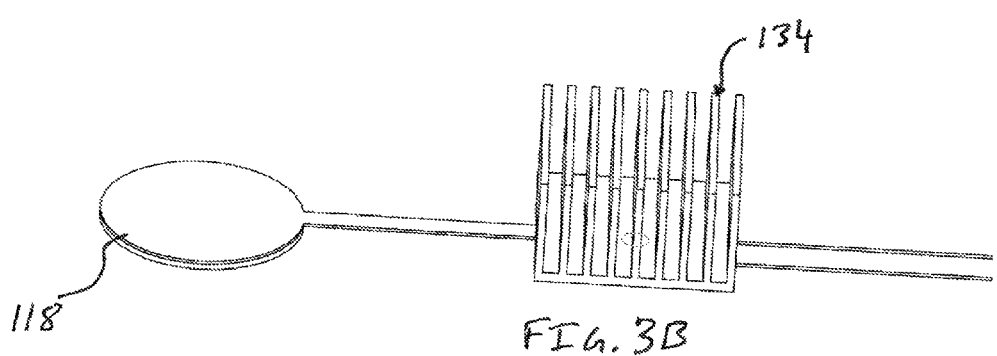
Figure 3C:
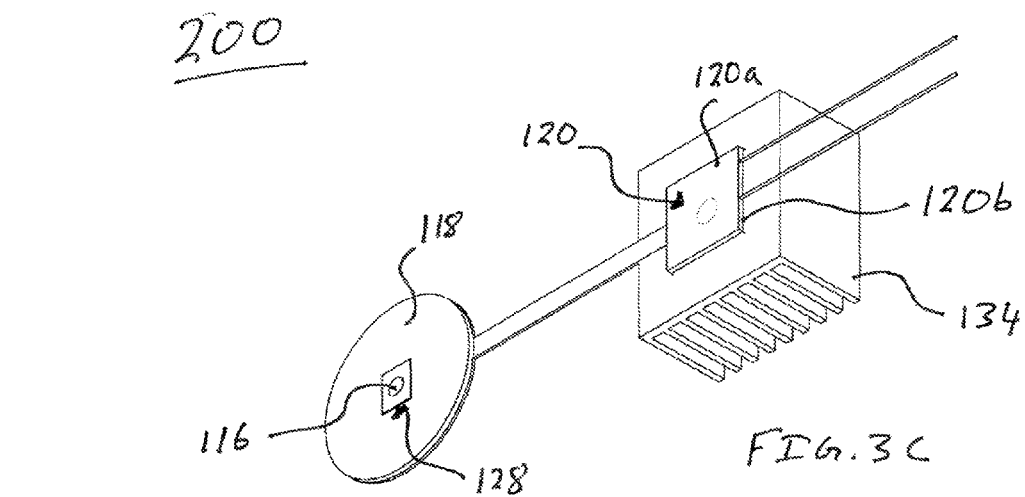

Referring now to FIG. 3, an alternative embodiment of an LED device is shown. LED device 200 may be as shown and described above by way of reference to FIG. 2, except the circuit board 118 of LED device 200 is separate from the thermoelectric module 120. The separation of the LED element 116 and the thermoelectric module 120 enables the LED element 116 to fit into small spaces where the thermoelectric module 120 and heat sink 134 will not fit, but still allows the thermoelectric module 120 to convert waste heat to electricity.

LED device 200 contains one or more LED elements 116 (one in the depicted exemplary embodiment) mounted on a circuit board 118. A thermally conductive heat slug 128 surrounds and contacts the base of the LED element 116. The heat slug 128 is in thermal communication with a first end of a heat pipe 132. The second end of the heat pipe 132 is thermally coupled to the first, hot side 120a of thermoelectric module 120. The heat pipe 132 may be a heat-transfer device which uses vaporization and condensation to absorb heat at the first end and release heat at the second end, as would be understood by persons skilled in the art. The second, cool side 120b of thermoelectric module 120 is thermally coupled to a heat sink 134. Electrical leads 124a and 124b are electrically coupled to the thermoelectric module 120 for electrically coupling the thermoelectric module 120 to a power grid, power storage device, an electronic or electrical device to be powered, a motor or other device for converting electrical energy into mechanical work, or the like.

The LED device 200 is powered by an external power source, as described above. During operation, the LED light element 116 creates heat which is conducted by the heat slug 128 and other components in the thermal pathway to the heat pipe 132. The heat is conducted through the heat pipe 132 to the first, hot side 120a of thermoelectric module 120, where it is dissipated by the heat sink 134. By applying heat to the thermoelectric module 120 with the heat pipe 132 and withdrawing heat from the second, cool side 120b of the thermoelectric module 120 using the heat sink 134, a temperature differential is established which results in the generation of an electrical current.

Figure 4A:
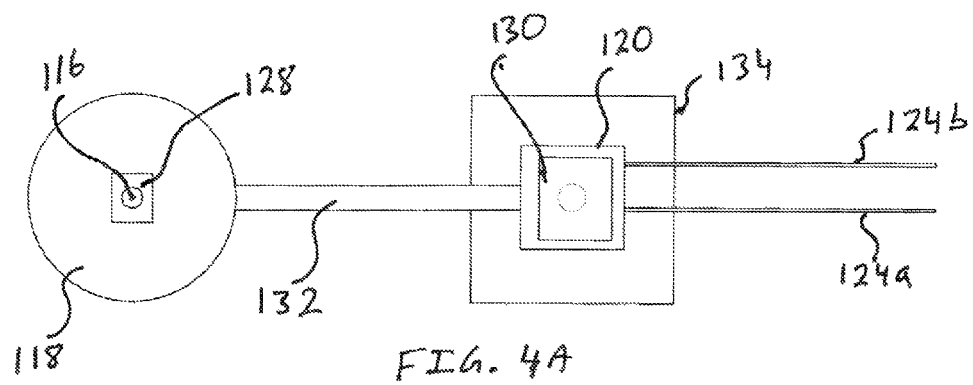
FIGS. 4A-4C illustrate yet another exemplary embodiment herein, wherein the LED lighting element(s) are remotely located with respect to the thermoelectric module and a heat pipe provides thermal communication therebetween, and further wherein a supplemental heater is provided.
Figure 4B:
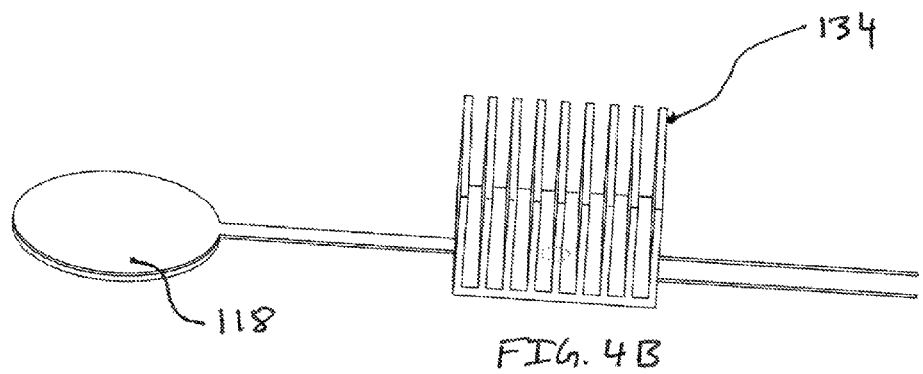
Figure 4C:
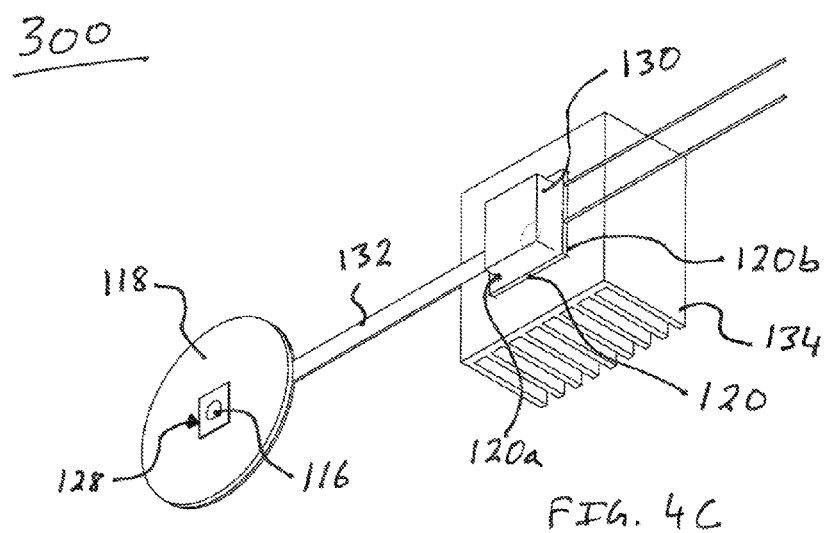

Referring now to FIG. 4, an alternative embodiment of the LED device as described above with reference to FIG. 3 is shown. LED device 300 contains a supplemental heater 130 as described above to increase the temperature difference across the thermoelectric module 120, thereby increasing the electricity generated. The supplemental heater 130 is in thermal communication with the first, hot side 120a of thermoelectric module 120. In this embodiment, the supplemental heater 130 is separated from the LED light 116 and the LED circuit board 118 thereby avoiding the potential for substantially heating the LED and LED circuit board. The additional heat from the supplemental heater 130 is supplied to the first, hot side 120a of the thermoelectric module 120 to enhance the temperature differential across the thermoelectric module 120.

The LED device 300 and supplemental heater 130 are powered by an external power source, as described above. During operation, the LED light element 116 creates heat which is conducted by the heat slug 128 and other components in the thermal pathway to the heat pipe 132. The heat is conducted through the heat pipe 132 to the first, hot side 120a of thermoelectric module 120, where it combines with additional heat from the supplemental heater 130. The waste heat from the LED light element 116 and the heat from the supplemental heater 130 are dissipated by the heat sink 134. By applying heat from the heat pipe 132 and the supplemental heater 130 to the first, hot side 120a of the thermoelectric module 120 and then withdrawing heat from the second, cool side 120b of the thermoelectric module 120 using the heat sink 112, a temperature differential is established which results in the generation of an electrical current.

The heat from the LEDs that is dissipated by the heat sink/housing members disclosed herein can also be transferred to other systems that utilize heat, such as a heating system, hot water system, heat storage system, or the like, by dumping the heat into a heat exchanger that resides above the LED lighting device to facilitate the transfer of the extra heat that is left over after cooling the LED and generating the electricity.

In other embodiments, the LED light device may be used in conjunction with an air conditioning system to cool the heat sink housing and thus make the device more efficient which, in turn, will produce more electricity.

LED lighting devices have the ability to do so much if utilized in a complete and efficient manner to maximize and take advantage of the heat generated by them. Given the number of LEDs that will be utilized over time in household, industrial, commercial and public places, there will be many light generators available for use to generate electricity and many opportunities to use the heat from the heat sink/housing members in accordance with this disclosure to feedback into heat pumps and heat collectors to augment required global heat generation.

The invention has been described with reference to the preferred embodiments. Modifications and alterations will occur to others upon a reading and understanding of the preceding detailed description. It is intended that the invention be construed as including all such modifications and alterations. It is to be understood that the foregoing descriptive matter is to be interpreted merely as illustrative of the invention and not as a limitation.

Having thus described the preferred embodiments, the invention is now claimed to be:

1. A light emitting diode (LED) device, comprising:
   one or more LED elements;
   a heat sink in thermal communication with said one or more LED elements, said heat sink for dissipating heat generated by said one or more LED elements;
   a thermoelectric module having a first surface in thermal communication with said one or more LED elements and a second surface in thermal communication with said heat sink, said thermoelectric module disposed between said one or more LED elements and said heat sink; and
   said heat sink defining a housing having an interior cavity, wherein said one or more LED elements and said thermoelectric module are received within said interior cavity; first and second electrical leads electrically coupled to said thermoelectric module and extending through said heat sink.

2. The LED device of claim 1, wherein said LED device is an LED lighting device.

3. The LED device of claim 1, wherein said heat sink is formed of a thermally conductive polymer material.

4. The LED device of claim 1, wherein said thermoelectric module is disposed remotely from said one or more LED elements.

5. The LED device of claim 4, further comprising:
   a heat pipe thermally coupling said one or more LED elements to said first surface.

6. The LED device of claim 5, further comprising:
a supplemental heater in thermal communication with said first surface.

7. A light emitting diode (LED) device, comprising:
one or more LED elements;
a heat sink in thermal communication with said one or more LED elements, said heat sink for dissipating heat generated by said one or more LED elements;
a thermoelectric module having a first surface in thermal communication with said one or more LED elements and a second surface in thermal communication with said heat sink; and
a supplemental heater in thermal communication with said first surface; a supplemental heater in thermal communication with said first said heat sink defining a housing having an interior cavity, wherein said one or more LED elements and said thermoelectric module are received within said interior cavity; first and second electrical leads electrically coupled to said thermoelectric module and extending through said heat sink.

8. The LED device of claim 1, wherein said thermoelectric module is selected from the group consisting of a thermoelectric cooler, thermoelectric generator, thermocouple, and Peltier device.

* * * * *